(12) United States Patent
Malado et al.

(10) Patent No.: US 10,504,736 B2
(45) Date of Patent: Dec. 10, 2019

(54) PLATING INTERCONNECT FOR SILICON CHIP

(71) Applicant: Texas Instruments Incorporated, Dallas, TX (US)

(72) Inventors: Jerard Canuto Malado, Baguio (PH); Antonio Rosario Taloban, Jr., Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/870,773

(22) Filed: Sep. 30, 2015

(65) Prior Publication Data
US 2017/0092571 A1    Mar. 30, 2017

(51) Int. Cl.
| | |
|---|---|
| H01L 21/288 | (2006.01) |
| H01L 21/768 | (2006.01) |
| H01L 21/3205 | (2006.01) |
| H01L 23/495 | (2006.01) |
| H01L 21/48 | (2006.01) |
| H01L 23/00 | (2006.01) |
| H01L 23/31 | (2006.01) |

(52) U.S. Cl.
CPC ...... *H01L 21/288* (2013.01); *H01L 21/32051* (2013.01); *H01L 21/76894* (2013.01); *H01L 23/3107* (2013.01)

(58) Field of Classification Search
CPC ............... H01L 23/49861; H01L 24/48–49
See application file for complete search history.

(56) References Cited

U.S. PATENT DOCUMENTS

| | | | | |
|---|---|---|---|---|
| 6,228,683 B1* | 5/2001 | Manteghi | ............ | H01L 23/3128 257/666 |
| 7,199,459 B2* | 4/2007 | Pu | ........................ | H01L 23/3128 257/673 |
| 7,208,825 B2* | 4/2007 | Pu | ........................ | H01L 23/3128 257/673 |
| 7,449,369 B2* | 11/2008 | Camacho | .............. | H01L 21/568 257/E21.502 |
| 7,956,453 B1* | 6/2011 | Kim | .................... | H01L 23/3128 257/692 |
| 9,040,361 B2* | 5/2015 | Chang | ..................... | H01L 24/20 438/126 |
| 2004/0140573 A1* | 7/2004 | Pu | ....................... | H01L 23/3128 257/782 |
| 2005/0161833 A1* | 7/2005 | Takeuchi | .............. | H01L 21/568 257/775 |
| 2005/0200006 A1* | 9/2005 | Pu | ....................... | H01L 23/3128 257/723 |
| 2006/0102994 A1* | 5/2006 | Pu | .......................... | H01L 24/97 257/686 |
| 2006/0151867 A1* | 7/2006 | Karnezos | ............ | H01L 23/3135 257/686 |
| 2007/0210424 A1* | 9/2007 | Ho | ........................ | H01L 25/105 257/678 |

(Continued)

*Primary Examiner* — William A Harriston
(74) *Attorney, Agent, or Firm* — Rose Alyssa Keagy; Charles A. Brill; Frank D. Cimino

(57) ABSTRACT

A system, method, and silicon chip package for providing connections between a die of a silicon chip package and external leads of the silicon chip package is disclosed. The connections are formed using a pre-mold etched with a trace pattern. The trace pattern provides rigid traces that connect the die with the external leads.

13 Claims, 4 Drawing Sheets

(56) References Cited

U.S. PATENT DOCUMENTS

| | | | |
|---|---|---|---|
| 2007/0284720 A1* | 12/2007 | Otremba | H01L 23/49524 257/690 |
| 2008/0258291 A1* | 10/2008 | Liu | H01L 23/49531 257/690 |
| 2010/0244268 A1* | 9/2010 | Tang | H01L 24/24 257/773 |
| 2011/0165729 A1* | 7/2011 | Liu | H01L 21/4842 438/107 |
| 2012/0074549 A1* | 3/2012 | Yow | H01L 23/3107 257/676 |
| 2013/0009327 A1* | 1/2013 | Tanaka | C08G 59/3218 257/789 |
| 2016/0035645 A1* | 2/2016 | Olsen | H01L 24/17 257/675 |
| 2016/0274999 A1* | 9/2016 | Florez-Larrahondo | G06F 11/3664 |

* cited by examiner

PLATING INTERCONNECT FOR SILICON CHIP

TECHNICAL FIELD

This invention relates generally to the field of silicon chip connections, and particularly connection between a silicon chip and a carrier, such as a lead frame.

BACKGROUND

In silicon chip fabrication, a common trend is to provide for smaller chips to support ever increasingly smaller devices. Alternatively and or in addition to smaller chips, there is a trend to add more functionality or components onto silicon chips. To facilitate such a trend to add more functionality and/or components onto silicon chips, there is need to provide smaller or thinner interconnections between such silicon chip components and/or leads that come from the components/silicon chips. This is particularly the case in silicon chip packages, such as quad flat packages or QFPs.

A QFP is a surface mount integrated circuit package with leads/connections that extend from each side of the package. A QFP and other silicon chip packages may be built up using wire bonding. Wire bonding is a process where interconnections are provided between an integrated circuit (IC) or other semiconductor device and its packaging during semiconductor device fabrication. In order to provide a smaller chip, the "flip chip" method may be incorporated in the IC fabrication. Flip chip processing adds additional steps in conventional chip fabrication. Such steps include adding attachment pads that are receptive to solder, also known as a bump interconnect process. To attach the flip chip into a circuit, the chip is inverted to bring the solder dots down onto connectors on the underlying electronics or circuit board.

Wire bonding has limitations as to how thin the leads can be. Furthermore, wire bonding is limited for die to die connections in multi-chip module (MCM) packages. Furthermore, wire bonding can be the largest contributor as to quality control of chips. In other words, wire bonding can be seen as where defects in chip packages are found. This may be attributable to weakened paths along the wire bonds. Although the flip chip process can overcome some of the wire bond shortcomings, the flip chip process involves additional and more complex steps that lead to greater silicon chip package costs. In certain cases, the added costs of assembling using the flip chip process is cost prohibitive for profitable product development.

SUMMARY

In accordance with an embodiment, a method is disclosed for forming interconnections between a silicon die and external leads of a silicon chip package by providing a pre-mold on a front assembly of the silicon chip package, the silicon die is disposed on the front assembly, etching a trace pattern on the pre-mold, and plating rigid traces onto the trace pattern to provide rigid trace connections between the silicon die and external leads.

In accordance with an embodiment, a silicon chip package is provided. The silicon chip package includes a front assembly having lead fingers; a die attached on the front assembly; a pre-mold formed over the front assembly and die; and a pattern of rigid traces etched onto the pre-mold that provide interconnections between the die and lead fingers.

In accordance with an embodiment, a system is provided. The system comprises one or more processors; memory configured to the one or more processors; the one or more processors are formed into a chip package; the chip package comprises one or more dies that are connected to external lead fingers of the chip package by rigid trace interconnections that are formed onto a pre-mold.

DETAILED DESCRIPTION

The following description provides many different embodiments, or examples, for implementing different features of the subject matter. These descriptions are merely for illustrative purposes and do not limit the scope of the invention.

Figure 1A:
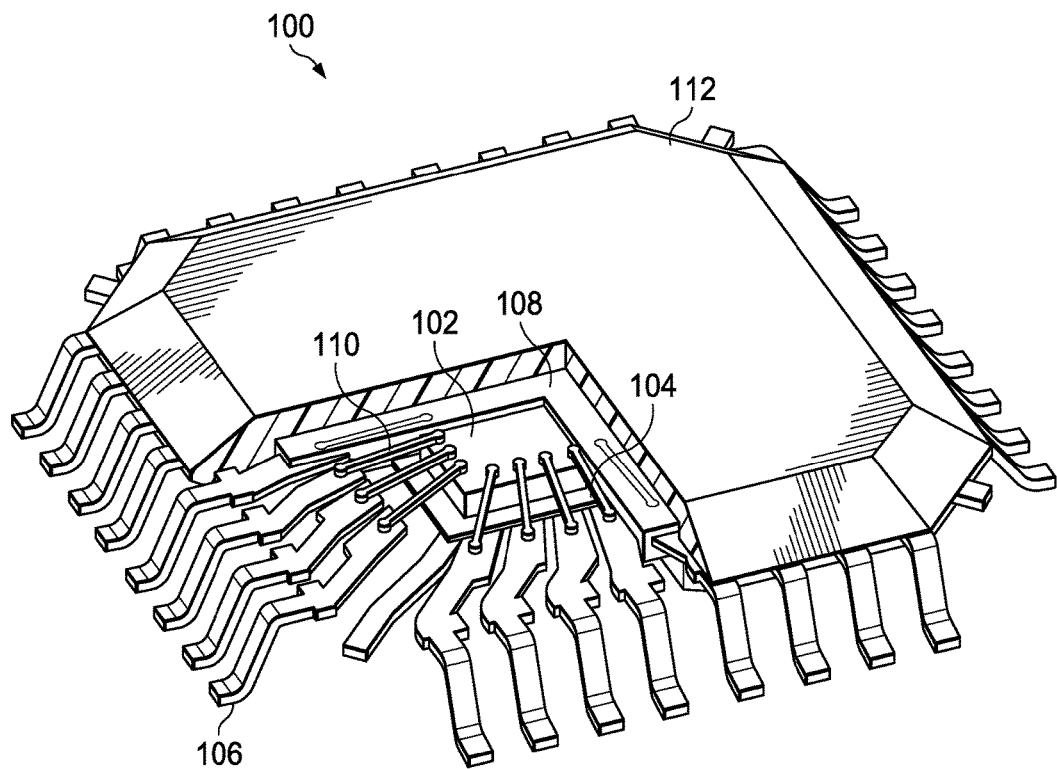
FIG. 1A is an isometric view of an example chip package fabricated using a rigid trace interconnect implementation according to some embodiment.

Referring to FIG. 1A, an isometric view of a silicon chip package 100 is shown according to some embodiment. The silicon chip package 100 can include a quad flat package or QFP and other chip packages. A die or silicon chip 102 may be one of several dies or chips included in the silicon chip package 100. The die or silicon chip 102 is processed onto a die pad 104. A lead finger 106 is representative of multiple lead fingers or external leads of the silicon chip package 100 that connect the die or silicon chip 102 to a system, such as an electronic device (not shown). The electronic device may be a computing device that includes one or more processors, memory(ies), peripheral devices, intra and inter connectivity that can include wireless and wired connections and others.

A pre-mold 108 is caste/formed as part of silicon chip package 100. The pre-mold 108 provides for the formation of a rigid trace interconnects, as represented by rigid trace 110. The rigid trace 110 is a made up of an electrically conductive material, such as copper, silver, gold, etc. The rigid trace 110 connects the die or silicon chip 102 to the lead finger 106. A mold 112 is formed around the silicon chip package 100.

Figure 1B:
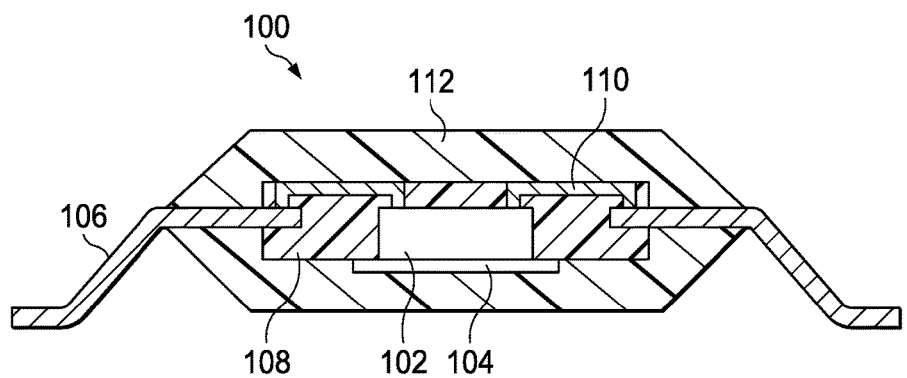
FIG. 1B is a cross sectional view of an example chip package fabricated using a rigid trace interconnect implementation according to some embodiment.

Referring to FIG. 1B, an example cross sectional view of a silicon chip package 100 is shown. The cross section view illustrates an exemplary implementation of various elements and their interconnections as described in FIG. 1A.

Figure 2:
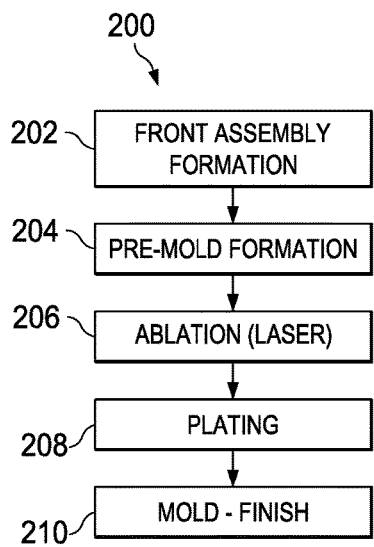
FIG. 2 illustrates an example flow diagram of a process for plating interconnections for chip packages according to some embodiment.

Referring to FIG. 2, an example flow diagram of a process for plating interconnections for chip packages is shown according to some embodiment. The process 200 may be applied in forming the silicon chip package 100 described above. At block 202, a front assembly of a chip package is formed. The front assembly may be formed according to known front assembly processes. Bond pads or connections points are determined/created before the front assembly process.

At block 204, a pre-mold is formed over the front assembly. The pre-mold can be made of a non-conductive plastic material, such as Ajinomoto build-up films (ABF) and the like. Ajinomoto build-up films (ABF) are typically used due to their features of good reliability, excellent process-ability and well-balanced properties. ABF can support tightly-spaced interconnect designs. ABF supports dense interconnect geometries because it is receptive of plated seed and conductive layers, for example in the micron range, thus allowing smaller geometries to be formed. The pre-mold is formed after die or silicon chip attachment (cure). In certain embodiments, the pre-mold material can cover from a die pad to a certain thickness just above the die and lead fingers of the carrier/carrier frame.

At block 206, an ablation, such as laser ablation is performed on the pre-mold material. In particular, a trace pattern is engraved using laser ablation where the pre-mold material will be etched out using laser beam. The trace pattern represents connections from the die or silicon chip to the lead fingers. Etching will be done until the bond pad and lead finger are exposed. In certain instances, the same machine may be used that etches out mold compound on package on package (POP) devices.

At block 208, plating is performed. In particular, a strip or the pre-mold trace pattern is plated. Strip covers can be placed over the strip using a frame and exposing the area (trace pattern) to be plated. The trace pattern is representative of the interconnections and where rigid traces are to be formed. A catalyst may be sprayed on the trace pattern, where the trace pattern is the only area to be plated. This process of catalyst spraying can be performed using exemplary sputtering. The strip can then be soaked in a solution (plating solution). This can be an electroless or chemical plating process. Plating material is deposited on the pattern to create interconnects. Interconnects, which are rigid traces, are exposed by removing strip cover(s). The strips can then be baked/heated to remove any moisture. At block 210, a mold is formed around the silicon chip package, to provide a finished product.

Figure 3A:
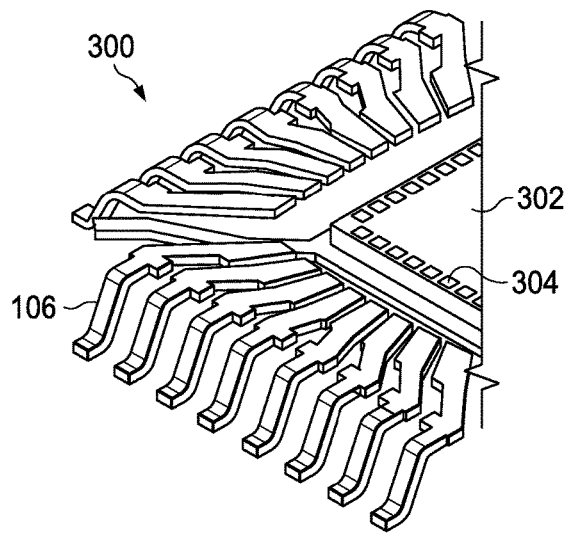
FIG. 3A illustrates an example front assembly process according to some embodiment.

Referring to FIG. 3A, a process 300 for forming a front assembly 302 is shown according to some embodiment. The front assembly 302 includes predetermined log points or connection points represented by bond pad 304 and lead fingers 106. The front assembly 302 can be formed or added using known techniques. A pre-mold 308 is formed after the die or silicon chip, such as die or silicon chip 102 is attached on the front assembly.

Figure 3B:
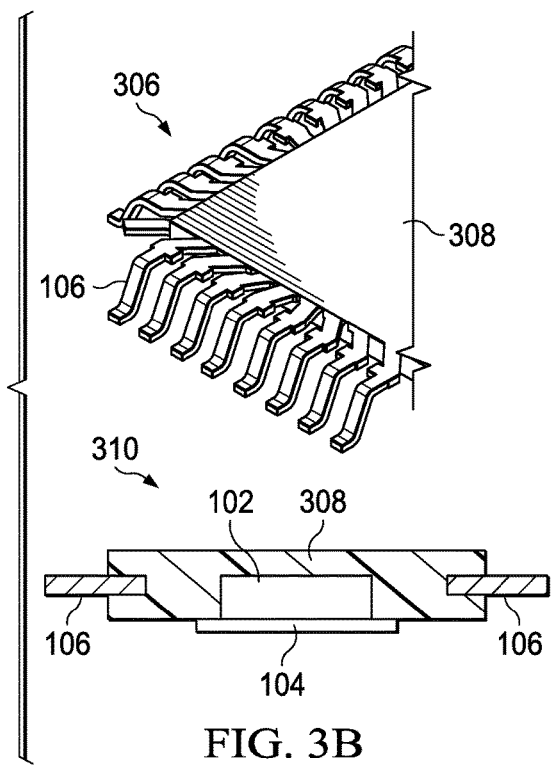
FIG. 3B illustrates an example pre-mold process according to some embodiment.

Referring to FIG. 3B, cross-sectional view 310 of a die is shown illustrating the process 306 for forming the pre-mold 308. Cross sectional view 310 illustrates that the die or silicon chip 102 is processed onto die pad 104. The formed pre-mold 308 covers the die pad 104 and has a thickness larger than the die or silicon chip 102 so the pre-mold 308 covers the silicon ship 102. Lead fingers 106 are at about the same plane as the top of die or silicon chip 102. The pre-mold process 306 may be performed using various techniques for mold processes. The formed pre-mold 308 may be made of a plastic material, such as ABF or the like.

Figure 3C:
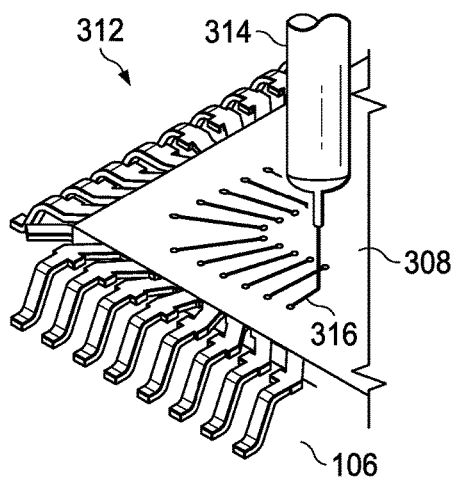
FIG. 3C illustrates an example ablation process according to some embodiment.

Referring to FIG. 3C, a process 312 for ablation is shown according to some embodiment. In this example, laser ablation is shown. A laser 314 etches a trace pattern as represented by 316 onto the pre-mold material 308. The laser ablation or etching is performed until a bond pad to the die or silicon chip 102 and lead finger 106 are exposed. As discussed, the lead finger 106 is at about the same plane level as the die or silicon chip 102. In particular, the lead finger 106 is at about the same plane as a bond pad to the die or silicon chip 102.

Figure 3D:
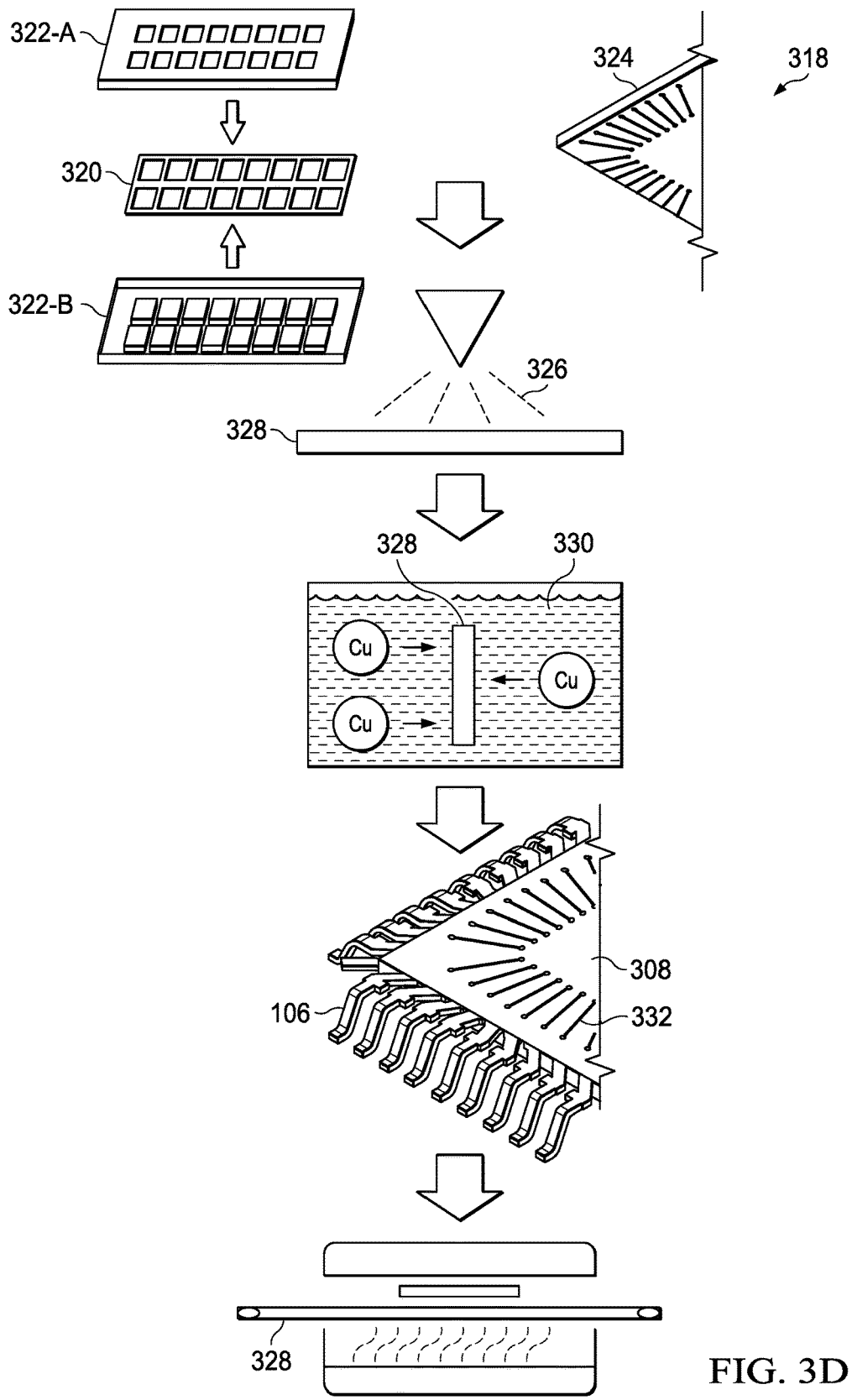
FIG. 3D illustrates an example plating process according to some embodiment.

Referring to FIG. 3D, a process 318 for plating is shown according to some embodiment. A strip 320 to be plated, is covered by strip covers 322. The strip covers 322 can be placed over the strip 320 using a frame and exposing the trace pattern to be plated, as represented by 324. After covering the strip 320, a catalyst 326 can be sprayed on to the trace pattern of the strip as represented by 328. The catalyst 326 can be sprayed using sputtering or similar process. The strip 328 is then soaked in a plating solution with conductive ions, such as copper (CU). The soaking can be done using an electroless plating process. The strip cover(s) is (are) removed exposing the interconnects as represented by 332. The strip 328 can then be baked/heated to remove any moisture.

Figure 4:
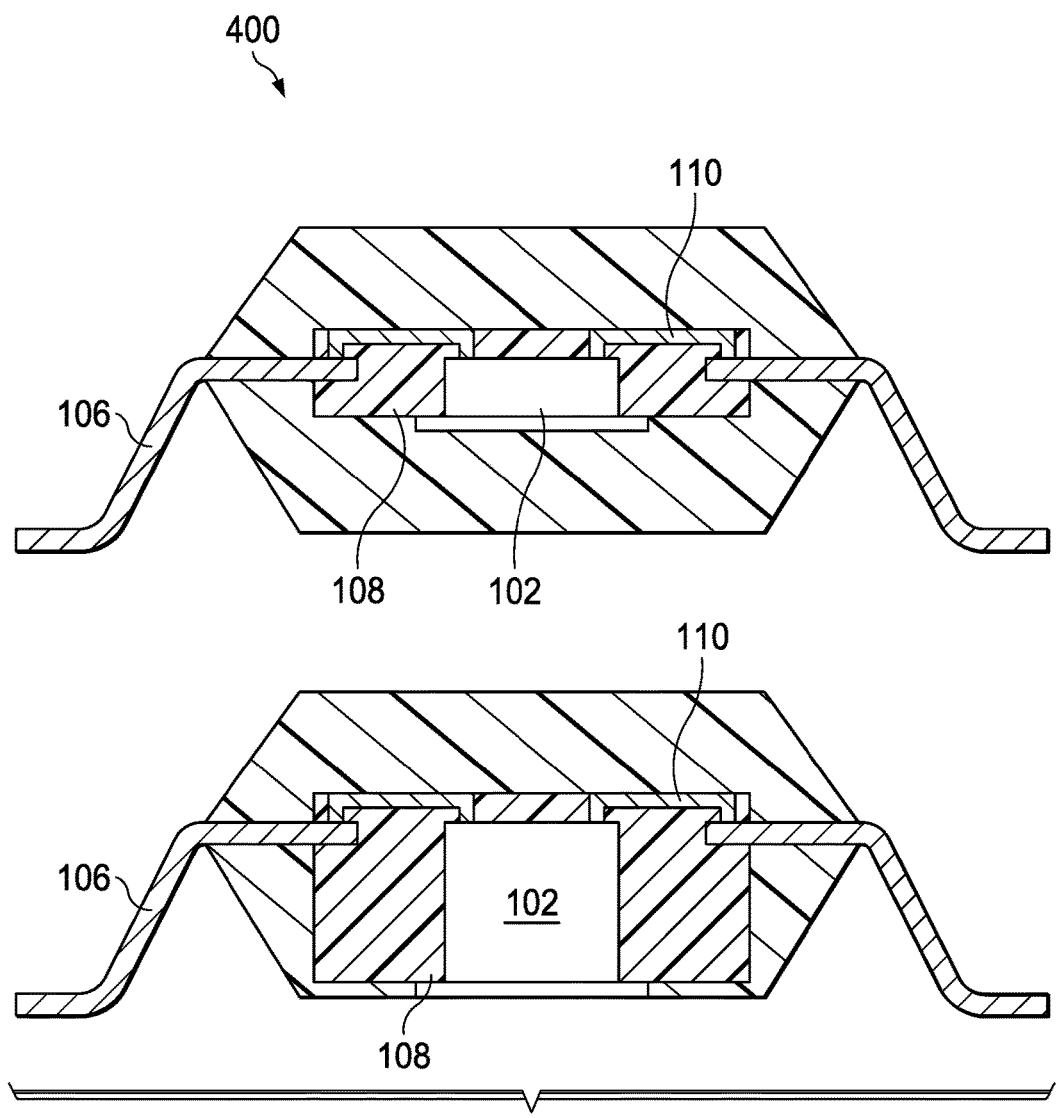
FIG. 4 is a cross sectional view of example chip packages fabricated using a rigid trace interconnect illustrating pre-mold thickness to die thickness.

Referring to FIG. 4, cross sectional views of a complete chip package 400 are shown according to some embodiments. In particular, cross sectional views illustrate thicknesses of the pre-mold 108 in relation to the die or silicon chip 102. The lead finger 106 is at about the same plane as the top of the die or silicon chip 102. The pre-mold 108 is about the thickness of the die or silicon chip 102 plus the thickness of rigid trace 110. Depending on the die or silicon chip 102 thickness, the pre-mold thickness is formed accordingly.

The foregoing outlines feature several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims. Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A silicon chip package comprising:
   a front assembly having lead fingers, the lead fingers having a first end that is closest to the front assembly and a second end that is furthest from the front assembly;
   a die attached on the front assembly;
   a plastic pre-mold formed over the die and a portion of the first end of the lead fingers;
   rigid traces formed into the plastic pre-mold, every portion of the rigid traces lying at or below a top surface of the plastic pre-mold, the rigid traces providing continuous interconnections between the die and the first end of the lead fingers; and
   a mold formed over the rigid traces, the plastic pre-mold, and a portion of the first end of the lead fingers, the mold not contacting any portion of the second end of the lead fingers.

2. The silicon chip package of claim 1, wherein trenches for the rigid traces are etched into the pre-mold by laser ablation.

3. The silicon chip package of claim 1, wherein the first end of each lead finger is formed above a lower surface of the die, and wherein the second end of each lead finger is formed below the lower surface of the die.

4. The silicon chip package of claim 1, wherein the die comprises bond pads that connect the rigid traces to the die.

5. The silicon chip package of claim 1 further comprising a die pad wherein the die is mounted on the die pad.

6. The silicon chip package of claim 1, wherein the silicon chip package is a quad flat package (QFP).

7. A semiconductor die package comprising:
   a die pad;
   a semiconductor die attached to the die pad;
   a plurality of lead fingers extending away from the die pad, each lead finger having a first end formed above the die pad and having a second end formed below the die pad;
   a pre-mold material formed over the semiconductor die and a portion of the first end of each lead finger;
   a plurality of rigid traces formed in the pre-mold material to connect the respective first end of each lead finger to the semiconductor die, every portion of the plurality of rigid traces lying at or below a top surface of the plastic pre-mold; and
   a mold formed over the rigid traces, the pre-mold material, and a portion of the first end of the lead fingers, the mold not contacting any portion of the second end of each lead finger.

8. The semiconductor die package of claim 7, wherein the rigid traces are formed in trenches in the pre-mold material formed by laser ablation.

9. The semiconductor die package of claim 7, wherein the semiconductor die comprises silicon.

10. The semiconductor die package of claim 7, wherein the die comprises bond pads that connect each respective rigid trace to the die.

11. The semiconductor die package of claim 7, wherein each rigid trace of the plurality of rigid traces is formed in a respective trench of the pre-mold material.

12. The semiconductor die package of claim 11, wherein each respective trench is etched in the pre-mold material.

13. The semiconductor die package of claim 7, wherein the die package is a quad flat package (QFP).

* * * * *